United States Patent
Matsuura et al.

(10) Patent No.: US 7,795,808 B2
(45) Date of Patent: Sep. 14, 2010

(54) ORGANIC ELECTROLUMINESCENT DISPLAY DEVICE HAVING PIXEL STRUCTURE AND TERMINAL STRUCTURE

(75) Inventors: Toshiyuki Matsuura, Mobara (JP); Masahiro Tanaka, Chiba (JP); Sukekazu Aratani, Hitachiota (JP); Masao Shimizu, Hitachi (JP)

(73) Assignee: Hitachi Displays, Ltd., Chiba (JP)

( * ) Notice: Subject to any disclaimer, the term of this patent is extended or adjusted under 35 U.S.C. 154(b) by 440 days.

(21) Appl. No.: 11/822,526

(22) Filed: Jul. 6, 2007

(65) Prior Publication Data
US 2008/0042550 A1   Feb. 21, 2008

(30) Foreign Application Priority Data
Jul. 7, 2006   (JP) ............... 2006-187506

(51) Int. Cl.
H01L 51/50 (2006.01)
H05B 33/26 (2006.01)

(52) U.S. Cl. ........................ 313/506; 313/504; 313/505; 313/500; 257/83; 257/88

(58) Field of Classification Search ................ 313/506, 313/504
See application file for complete search history.

(56) References Cited

U.S. PATENT DOCUMENTS 6,781,162 B2    8/2004  Yamazaki et al.
2003/0038594 A1*  2/2003 Seo et al. .................... 313/506
2003/0201447 A1* 10/2003 Yamazaki et al. ............ 257/79
2003/0201716 A1* 10/2003 Yamazaki et al. .......... 313/506
2005/0110023 A1   5/2005 Lee et al.
2005/0280361 A1* 12/2005 Uhlig et al. ................. 313/504
2006/0243976 A1* 11/2006 Shin ........................... 257/59

FOREIGN PATENT DOCUMENTS

JP    2001-56650     8/1999
JP    2003-234188   12/2002

* cited by examiner

Primary Examiner—Sikha Roy
(74) Attorney, Agent, or Firm—Stites & Harbison, PLLC; Juan Carlos A. Marquez, Esq.

(57) ABSTRACT

TFTs are formed on a substrate. An interlayer insulation film is formed on the substrate to cover the TFTs. Lower layer portions of SD lines formed of a multi-layered film which are formed on the interlayer insulation film constitute a lower electrode of an organic EL layer. An uppermost layer of the SD line is formed of a chemically stable metal oxide film, and the SD layer is used as it is. On the other hand, as a lower electrode of an organic EL layer, an upper layer of the SD line is removed and an Al—Si, alloy film of the SD line is used. Due to such a constitution, it is possible to reduce a cost by shortening steps while holding the performance and the reliability of organic EL.

11 Claims, 4 Drawing Sheets

US 7,795,808 B2

ORGANIC ELECTROLUMINESCENT DISPLAY DEVICE HAVING PIXEL STRUCTURE AND TERMINAL STRUCTURE

CROSS-REFERENCE TO RELATED APPLICATIONS

The disclosure of Japanese Patent Application No. 2006-187506 filed on 2006, Jul. 7 including the claims, the specification, the drawings and the abstract is incorporated herein by reference in its entirety.

BACKGROUND OF THE INVENTION

1. Field of the Invention

The present invention relates to the pixel structure and the terminal structure of an organic EL display device, and more particularly to the pixel structure and the terminal structure of an organic EL display device of top-emission-type.

2. Description of Related Art

Although a main stream of the conventional display device is a CRT, a liquid crystal display device, a plasma display device and the like which are flat display devices have been practically used in place of the CRT and a demand for such flat display devices is increasing. In addition to these display devices, developments and efforts for practical use of a display device which uses organic electro luminescence (hereinafter, referred to as organic EL display device) and a display device which arranges electron sources utilizing field emission in a matrix array and phosphors arranged on an anode is radiated with light thus forming an image (hereinafter referred to as FED display device) have been also in progress.

The organic EL display device has features such as (1) the organic EL display device is of a self-luminous type compared with liquid crystal and hence, a backlight is unnecessary, (2) power source necessary for emission of light is low, that is, equal to or below 10V and hence, the power consumption can be decreased, (3) compared to the plasma display device or the FED display device, the vacuum structure is unnecessary thus the organic EL display device is suitable for achieving the reduction of weight and the reduction of thickness, (4) a response time is short, that is, several micro seconds and hence, the organic EL display device exhibits the excellent motion picture property, and (5) the viewing angle is 170 degrees or more.

FIG. 11 is a cross-sectional view of the pixel structure of a so-called bottom-emission-type organic EL display device which has been developed conventionally. FIG. 11 is a cross-sectional view of a pixel portion of the display device which drives organic EL using a thin film transistor (TFT) as a switching element. In FIG. 11, an undercoat 2 is applied to an upper surface of a glass substrate 1. The undercoat 2 plays a role of preventing impurities from a glass substrate from contaminating TFTs and the organic EL. A semiconductor layer 3 is formed of a source portion, a channel portion and a drain portion. A gate insulation film 4 is formed to cover the semiconductor layer 3, a gate electrode 5 is formed on the gate insulation film 4, and an interlayer insulation film 6 is formed to cover the gate electrode 5. While an SD line 7 is formed on the interlayer insulation film 6, the SD line 7 is connected with the source portion or the drain portion formed on the semiconductor layer 3 via a through hole formed in the interlayer insulation film 6 thus playing a role to take out a signal from the TFT. A passivation film 8 is formed to cover the SD line 7 thus protecting the whole TFT.

While a transparent electrode (ITO) 12 which constitutes a lower electrode of an organic EL layer is formed on the passivation film 8, the transparent electrode 12 is connected with the SD line 7 via a through hole formed in the passivation film 8. Further, on the transparent electrode 12 and the passivation film 8, a bank 11 for removing each pixel is formed. On a portion of the transparent electrode 12 where the bank 11 is not formed, an organic EL layer 9 which constitutes a light emitting portion is stacked. Then, a metal layer 10 which constitutes an upper electrode is formed on the organic EL layer 9. The organic EL layer 9 is generally formed of a plurality of layers and emits light when a voltage is applied between a cathode and an anode. Here, the lower electrode is formed of a transparent electrode, and all of the passivation film 8, the interlayer insulation film 6 and the undercoat 2 are transparent and hence, light emitted from the organic EL layer 9 advances in the direction indicated by an arrow L in FIG. 12 (bottom emission). On the other hand, light which advances toward the upper electrode 10 is reflected on metal 10 which constitutes an upper electrode and is also advances in the direction indicated by an arrow L in FIG. 11.

The bottom-emission-type organic EL display device has following drawbacks. That is, a light emission effective region is limited due to the relationship with a switching element such as a TFT. Light from the EL may influence an operation of the TFT which is the switching element. Light from the EL has to pass through many layers such as the passivation film 8, the interlayer insulation film 6, the undercoat 2, the glass substrate 1 and the like and hence, a light takeout efficiency is lowered due to absorption of light in respective layers, the reflection of light between respective layers and the like.

Although the top-emission-type organic EL display device can overcome some of drawbacks attributed to the above-mentioned bottom-emission-type organic EL display device, the structure is still complicated and hence, the organic EL display device still suffers from drawbacks such as a high manufacturing cost and the insufficient reliability.

Here, patent document 1 describes the pixel structure of an organic EL display device which has the structure similar to the above-mentioned structure and is applicable to the top-emission-type structure. Further, patent document 2 describes the constitution which uses a layer substantially equal to the SD line as an anode of an organic EL layer.

[Patent Document 1] JP-A-2001-56650
[Patent Document 2] JP-A-2003-234188

SUMMARY OF THE INVENTION

To allow the organic EL display device to surpass other flat display device, it is inevitable for the organic EL display device to realize tasks such as the reduction of manufacturing cost, the enhancement of brightness, the enhancement of reliability and the like. The top-emission-type organic EL display device has a relatively large degree of freedom with respect to a positions and an area of light emitting portions by the organic EL and, at the same time, the number of layers which allows light from the light emitting layer to pass therethrough can be reduced and hence, with respect to the brightness, it is possible to enhance the brightness compared to the bottom-emission-type organic EL display device. However, the pixel structure does not substantially differ from the above-mentioned pixel structure and hence, the drastic reduction of manufacturing cost cannot be achieved. That is, the number of layers to be formed is large and hence, the process becomes long and this pushes up a manufacturing cost.

On the other hand, the terminal portion which supplies electric signals for driving the organic EL has a conducive layer thereof exposed to the outside air and hence, the reliability of the terminal portion is questioned. In forming the terminal portion using stable metal oxide having conductivity or the like, conventionally, a special material is used and an additional process is used for forming the terminal portion. Accordingly, the structure of the terminal portion also becomes a factor to push up a manufacturing cost.

Accordingly, it is an object of the present invention to provide means for suppressing a manufacturing cost while maintaining the reliability of an operation of a top-emission-type organic EL display device. Followings are specific means of the present invention.

(1) In an organic EL display device which forms organic EL layers between an upper electrode which constitutes an anode and a lower electrode which constitutes a cathode, and makes use of emission of light generated by supplying an electric current to the organic EL layer, TFTs each of which has a semiconductor layer, a gate insulation film and a gate electrode are formed on a substrate, an interlayer insulation film is formed on the substrate to cover the TFTs, SD lines are connected with semiconductor layers of the TFTs and, at the same time, extend over the interlayer insulation film thus constituting the lower electrodes of the organic EL layers, each SD line includes a layer made of metal or metal alloy which reflects light, the upper electrode is formed of a transparent electrode, terminal portions which are connected with the TFTs and the upper electrodes are formed on the substrate, and the terminal portions are formed on the same layer as the SD lines.

(2) In the organic EL display device having the means (1), the SD line is formed of a plurality of layers, and an uppermost layer is formed of a transparent conductive film.

(3) In the organic EL display device having the means (2), the transparent conductive film which forms the uppermost layer of the SD line is made of ITO, IZO, $WO_3$ or $MoO_3$.

(4) In the organic EL display device having the means (1), the SD line is formed of a plurality of layers, and an uppermost layer is made of Ti or TiN.

(5) In the organic EL display device having the means (1), a layer of the SD line which is brought into contact with the semiconductor layer is made of Mo, W, Ta, Ti or alloy which contains one of Mo, W, Ta, Ti.

(6) In the organic EL display device having the means (1), a layer of the SD line made of metal or metal alloy which reflects light is made of Al or alloy of Al and Si.

(7) In an organic EL display device which forms organic EL layers between an upper electrode which constitutes an anode and a lower electrode which constitutes a cathode, and makes use of emission of light generated by supplying an electric current to the organic EL layer, TFTs each of which has a semiconductor layer, a gate insulation film and a gate electrode are formed on a substrate, an interlayer insulation film is formed on the substrate to cover the TFTs, SD lines are connected with semiconductor layers of the TFTs and, at the same time, extend over the interlayer insulation film thus constituting the lower electrodes of the organic EL layers, each SD line includes a layer made of metal or metal alloy which reflects light, the upper electrode is formed of a transparent electrode, terminal portions which are connected with the TFTs and the upper electrodes are formed on the substrate, and the terminal portions are formed on the same layer as the gate electrodes.

(8) In the organic EL display device having the means (7), the gate electrode is made of Mo, W, Ta, Ti or alloy which contains one of Mo, W, Ta, Ti.

(9) In the organic EL display device having the means (7), the gate electrode is formed of a plurality of layers, and an uppermost layer is made of any one of Ti, TiN, ITO and IZO.

(10) In an organic EL display device which forms organic EL layers between an upper electrode and a lower electrode, and makes use of emission of light generated by supplying an electric current to the organic EL layer, TFTs each of which has a semiconductor layer, a gate insulation film and a gate electrode are formed on a substrate, an interlayer insulation film is formed on the substrate to cover the TFTs, SD lines each of which is formed of a plurality of layers are connected with semiconductor layers of the TFTs and, at the same time, portions of the plurality of layers of the SD lines extend over the interlayer insulation film thus constituting the lower electrodes of the organic EL layers, each SD line includes a layer made of metal or metal alloy which reflects light, the upper electrode is formed of a transparent electrode, terminal portions which are connected with the TFTs and the upper electrodes are formed on the substrate, and the terminal portions are formed on the same layer as the SD lines.

(11) In the organic EL display device having the means (10), an uppermost layer of the SD line is made of ITO, IZO, $WO_3$ or $MoO_3$ and ITO, IZO, $WO_3$ or $MoO_3$ does not constitute a lower electrode of the organic EL layer.

(12) In the organic EL display device having the means (10), the SD line is formed of a plurality of layers, and an uppermost layer is made of Ti or TiN.

(13) In the organic EL display device having the means (10), a layer of the SD line which is brought into contact with the semiconductor layer is made of Mo, W, Ta, Ti or alloy which contains one of Mo, W, Ta, Ti.

(14) In the organic EL display device having the means (10), a layer of the SD line made of metal or metal alloy which reflects light is made of Al or alloy of Al and Si.

(15) In the organic EL display device having the means (10), a layer of the SD line which is brought into contact with the organic EL layer and constitutes a lower electrode is made of Al, alloy of Al and Si or Cu, alloy of Al and lanthanoids, or Ag.

Followings are advantageous effects obtained by the above-mentioned respective means.

According to the means (1), the SD line forms the lower electrode of the organic EL layer and the passivation film also functions as a bank for separating respective pixels and hence, a step for additionally forming the lower electrode of the organic EL layer and a step for additionally forming the bank can be omitted whereby a manufacturing cost of the organic EL display device can be largely reduced. Further, since the terminal portions are formed on the same layer as the SD lines, it is unnecessary to additionally form lines as the terminal portions whereby the manufacturing cost can be further reduced.

According to the means (2), in addition to the advantageous effects obtained by the means (1), the uppermost layer of the terminal portion is formed of the chemically stable transparent conductive film and hence, the reliability of the terminal portion can be ensured.

According to the means (3), in addition to the advantageous effects obtained by the means (1), the uppermost layer of the terminal portion is made of ITO, IZO, $WO_3$ or $MoO_3$ which is chemically stable and is easily obtainable and hence, the reliability of the terminal portion can be ensured and, at the same time, the manufacturing cost can be suppressed.

According to the means (4), in addition to the advantageous effects obtained by the means (1), the uppermost layer of the terminal portion is made of chemically stable Ti or TiN and hence, the reliability of the terminal portion can be ensured.

According to the means (5), in addition to the advantageous effects obtained by the means (1), the surface of the SD line which is brought into contact with the semiconductor layer is made of metal which does not contaminate the semiconductor layer and hence, an operation of the TFT can be made stable.

According to the means (6), in addition to the advantageous effects obtained by the means (1), by using Al, Al—Si alloy or the like as a material of the reflection metal of the SD line, the SD line exhibits the small electric resistance as a line and metal having high reflectance can be used as the lower electrode of the organic EL layer thus allowing the organic EL display device to exhibit high performance.

According to the means (7), in addition to the advantageous effects obtained by the means (1), the terminal portions are formed on the same layer as the gate electrodes and hence, it is unnecessary to additionally form lines as the terminal portions whereby the manufacturing cost can be reduced.

According to the means (8), in addition to the advantageous effects obtained by the means (1), the gate electrode is made of metal having high melting point and hence, there is no possibility that another layer of the TFT is contaminated. Further, even when the gate terminal is made of metal having high melting point, the gate terminal exhibits the stable property.

According to the means (9), in addition to the advantageous effects obtained by the means (1), the uppermost layer of the terminal portion is formed of any one of Ti, TiN, ITO and IZO which are chemically stable and hence, it is possible to ensure the reliability of the terminal portion.

According to the means (10), the SD line is formed of a plurality of layers, a partial layer is formed into the lower layer of the organic EL layer, and the passivation film also functions as a bank for separating respective pixels and hence, a step for additionally forming the lower electrode of the organic EL layer and a step for additionally forming the bank can be omitted whereby a manufacturing cost of the organic EL display device can be largely reduced. Further, out of the plurality of SD line layers, the material which is particularly suitable as the cathode of the organic EL layer can be used as the lower electrode of the organic EL layer and hence, it is possible to maintain the property of the organic EL at a high level. Further, the terminal portions are formed on the same layer as the SD lines, it is unnecessary to additionally form lines as the terminal portions whereby the manufacturing cost can be further reduced.

According to the means (11), in addition to the advantageous effects obtained by the means (10), the uppermost layer of the terminal portion is made of the chemically stable metal oxide and hence, the stability of the terminal portion can be enhanced.

According to the means (12), in addition to the advantageous effects obtained by the means (10), the uppermost layer of the terminal portion is made of the chemically stable metal Ti or TiN and hence, the stability of the terminal portion can be enhanced.

According to the means (13), in addition to the advantageous effects obtained by the means (10), the surface of the SD line which is brought into contact with the semiconductor layer is made of metal which does not contaminate the semiconductor layer and hence, an operation of the TFT can be made stable.

According to the means (14), in addition to the advantageous effects obtained by the means (10), by using Al or Al—Si alloy as a material of the reflection metal of the SD line, the SD line exhibits the small electric resistance as a line and metal having high reflectance can be used as the lower electrode of the organic EL layer thus allowing the organic EL display device to exhibit high performance.

According to the means (15), in addition to the advantageous effects obtained by the means (10), the lower electrode of the organic EL layer is made of Al, Al—Si alloy or the like which exhibits high property as the cathode and hence, the organic EL display device exhibits the high property.

DESCRIPTION OF THE PREFERRED EMBODIMENTS

The present invention is explained in detail in conjunction with embodiments.

Embodiment 1

Figure 1:
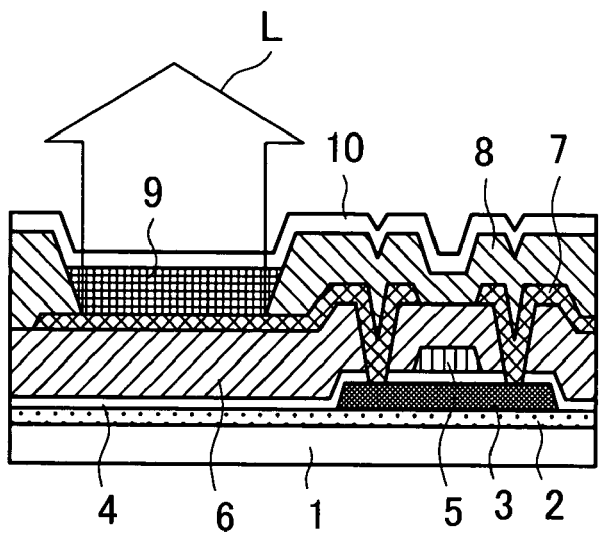
FIG. 1 is a cross-sectional view of a pixel portion of the present invention.
Figure 2:
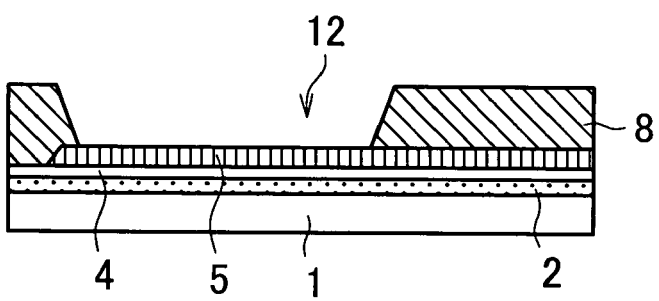
FIG. 2 is a cross-sectional view of a terminal portion of the present invention.

FIG. 1 shows the cross-sectional structure of a pixel portion of an organic EL display device of a top-emission-type according to the present invention, and FIG. 2 shows the cross-sectional structure of a terminal portion 12. In FIG. 1, a substrate 1 is made of glass in this embodiment. However, in case of the top-emission-type organic EL display device, the substrate 1 is not required to allow light to pass therethrough and hence, it is unnecessary to limit a material of the substrate 1 to glass and the substrate 1 may be made of metal such as stainless steel or a plastic material such as PET or PES. An undercoat 2 plays a role of a barrier against impurities from the substrate 1. On the other hand, it is important for the undercoat 2 to ensure adhesiveness with a semiconductor layer 3 formed thereon. In this embodiment, the undercoat 2 is formed of a silicon oxide film, a silicon nitride film or a stacked film constituted of the silicon oxide film and the silicon nitride film. When the two-layered film is used as the undercoat 2, a film thickness is formed such that, for example, the silicon nitride film which constitutes a lower layer has a thickness of 150 nm and the silicon oxide film which constitutes an upper layer has a thickness of 10 nm.

The semiconductor layer 3 is formed of an amorphous Si film which is produced by a CVD method, or a polysilicon film which is produced by annealing an amorphous Si film using a laser. A source portion or a drain portion to which conductivity is imparted by ion implantation is formed on both sides of the semiconductor layer 3. A film thickness of the semiconductor layer 3 is, for example, 50 nm.

A gate insulation film 4 is formed on the substrate 1 to cover the semiconductor layer 3. The gate insulation film 4 is formed of a silicon oxide film or a silicon nitride film produced by a CVD method, or a stacked film constituted of these films. A film thickness of the gate insulation film 4 is, for example, 100 nm. A gate metal layer which constitutes a gate electrode 5 is formed on the gate insulation film 4 by sputtering or the like. By patterning such a metal layer, it is possible to form not only the gate electrode 5 but also a gate line layer. Further, in this embodiment, as shown in FIG. 2, the gate line layer may be also used as a terminal portion 12. As a material of a gate metal layer, high-melting point metal such as Mo, W, Ta, Ti or alloy of these metals may be preferably used. Still further, the gate metal layer may be formed of a stacked film constituted of these metals or alloy. When the gate metal layer is also used as the terminal portion 12, it is necessary to form an uppermost layer using a stable material such as Ti, TiN, ITO or IZO. A film thickness of the gate electrode 5 is, for example, 150 nm.

An interlayer insulation film 6 is formed on the substrate 1 to cover the gate electrode 5. The interlayer insulation film 6 has a function of insulating a gate line which is connected to the gate electrode 5 and a signal line which is connected to a SD line layer 7. The interlayer insulation film 6 is formed of a silicon oxide film or a silicon nitride film which is produced by a CVD method. The film thickness of the interlayer insulation film 6 is, for example, 500 nm.

An SD metal layer which constitutes the SD line layer 7 is formed on the substrate 1 by sputtering or the like to cover the interlayer insulation film 6. This SD metal layer plays an important role in the present invention. The SD metal layer is formed into signal lines by patterning, and the SD metal layer is connected with the source portion or the drain portion of the semiconductor layer 3 via a through hole formed in the interlayer insulation film. In the present invention, the SD line layer 7 extends below an organic EL layer 9 and is used as a lower electrode of the organic EL layer 9. To use the SD line layer 7 as the lower electrode of the organic EL layer 9, it is necessary to form the SD line layer 7 using a material which possesses high reflectance as well as conductivity. Further, when the SD line layer 7 is formed of a stacked film, at least one layer is required to be made of a material which has high reflectance. Further, with respect to the SD line layer 7, a layer which constitutes the lower electrode of the organic EL or the like is preferably made of a material which exhibits a small work function suitable as a cathode material of the organic EL layer 9. In this embodiment, the SD line layer 7 may be made of alloy of Al, Si, Cu and Al, alloy of lanthanoids-based element and Al, Ag or the like.

Since the SD line layer 7 is brought into direct contact with the semiconductor layer 3, as a material of a portion of the SD line layer 7 which is brought into contact with the semiconductor layer 3, it is necessary to use a material which does not contaminate a semiconductor. Accordingly, as the material of the portion of the SD line layer 7, it is desirable to use Ti, TiN, W, alloy of these metals or Mo, or alloy of Mo.

Further, in the present invention, the SD line layer 7 may be also used as the terminal portion 12. That is, in FIG. 2, the terminal portion 12 is formed of the gate metal. However, the terminal portion 12 may be formed using the SD line layer 7 in place of the gate metal. In this case, the SD line layer 7 may adopt the multi-layered structure and an uppermost layer thereof is formed of stable metal or metal oxide. For example, in such a case, the upper layer may be made of ITO, IZO, $WO_3$, $MoO_3$ or the like. Accordingly, when the SD line layer 7 is also used as the terminal, the SD line layer 7 is required to possess property that at least the uppermost layer is stable for outside air in addition to the high reflectance property as the EL lower electrode and no possibility of contaminating the semiconductor. Such property can be obtained by allowing the SD line layer 7 to adopt the stacked structure.

Thereafter, to ensure the insulation of the SD line layer 7 and the outside and, at the same time, to prevent the contamination of TFT from the outside, a passivation film 8 is formed on the substrate 1. In this embodiment, the passivation film 8 is formed of a silicon nitride film produced by a CVD method. A film thickness of the silicon nitride film is, for example, 300 nm. In this embodiment, the passivation film 8 plays a role of a bank which separates each pixel from other pixels together with the above-mentioned role. A portion of the passivation film 8 where the organic EL is formed is removed by etching, and a remaining portion constitutes the bank for separating the pixel from other pixels. Further, when the SD line layer 7 is formed of a multi-layered film, an upper layer portion of the SD line layer 7 is removed by etching thus forming a layer which facilitates the injection of electrons to the organic EL layer, for example, the layer made of Al, Al alloy or the like into the lower electrode of the organic EL layer 9.

Figure 3:
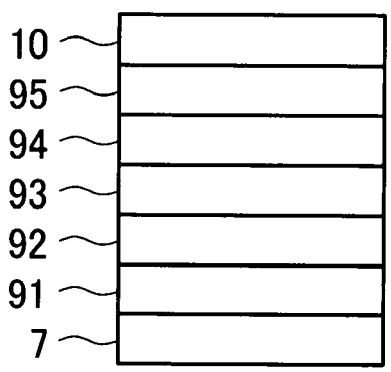
FIG. 3 is a cross-sectional view of an organic EL layer.

FIG. 3 is a schematic cross-sectional view showing one example of the organic EL layer 9 which constitutes a light emitting portion. In FIG. 3, a charge injection layer 91 is formed on the SD line layer 7 which constitutes the lower electrode. The charge injection layer 91 is, for example, an LiF film having a thickness of 0.5 nm which is formed by a vacuum vapor deposition method. The charge injection layer 91 is provided for facilitating the injection of electrons from a cathode which constitutes the lower electrode. An electron transport layer 92 is formed on the charge injection layer 91. The electron transport layer 92 is, for example, a tris (8-quinolinol) aluminum (hereinafter, abbreviated as Alq) having a thickness of 20 nm which is formed by a vacuum vapor deposition method. This layer is provided for efficiently carrying electrons to a light emitting layer 93 with the least resistance. The light emitting layer 93 is formed on the electron transport layer 92. In this light emitting layer 93, electrons and holes are re-coupled to generate the EL light emission. The light emitting layer 93 is, for example, formed of a co-vapor deposition film having a thickness of 20 nm which is made of Alq and quinacridone (abbreviated as Qc). A vapor-deposition speed ratio of Alq and Qc is 40:1. A hole transport layer 94 is formed on the light emitting layer 93. The hole transport layer 94 is provided for efficiently carrying holes supplied from the anode to the light emitting layer 93 with the least resistance. The hole transport layer 94 is formed of an a-NPD film having a thickness of 50 nm which is formed by vapor deposition. A hole injection layer 95 is formed on the hole transport layer 94. The hole injection layer 95 is provided for facilitating the injection of holes from the anode. The hole injection layer 95 is a copper Phthalocyanine film having a thickness of 50 nm which is formed by vapor deposition. An upper electrode 10 which constitutes the anode is formed on the hole injection layer 95. Here, there may be a case in which a transparent metal oxide having a thickness of 15 nm is formed as a buffer layer by an EB deposition method between the hole injection layer 95 and the upper electrode 10. As a material of metal oxide of the buffer layer, $V_2O_5$, $MoO_3$, $WO_3$ or the like is named. The buffer layer is mainly provided for preventing damages which the organic EL layer receives in sputtering an anode material.

Since the organic EL display device of the present invention is of a top-emission-type, it is necessary to form the upper electrode 10 which constitutes the anode using a transparent electrode. Light emitted from the organic EL is radiated in the direction indicated by an arrow L in FIG. 1. The upper electrode 10 is provided for applying a fixed DC voltage to the organic EL layer 9 and hence, it is unnecessary to separate the upper electrode 10 for every pixel. Even when the upper electrode 10 is separated for respective pixels, it is possible to supply voltages from a common terminal. Further, there exists possibility that the upper electrode 10 is exposed to the outside air and hence, it is necessary to ensure the chemical stability. Further, the upper electrode is required to possess the stable electric properties such as resistance for a long period. As a material of the upper electrode 10 which can be used in this embodiment, Ti, TiN, ITO, IZO or the like can be named.

As has been described heretofore, according to this embodiment, it is possible to obtain following advantages, that is, (1) steps such as the formation and the patterning of the lower electrode of the organic EL layer 9 which is formed separately from the SD line layer 7 can be omitted, (2) the passivation film 8 also functions as the bank and hence, an additional step for forming the bank can be omitted, and (3) the terminal portion 12 is formed of the SD line layer 7 or the gate line layer and hence, a process for forming the terminal portion 12 can be omitted. Accordingly, this embodiment can largely reduce a manufacturing cost. Further, in this embodiment, by allowing the SD line layer 7 or the gate line layer to adopt the material, the film structure or the stacked layer structure optimum to this embodiment, it is possible to realize the reduction of the manufacturing cost without lowering the reliability or the display property of the organic EL display device.

Embodiment 2

Figure 4:
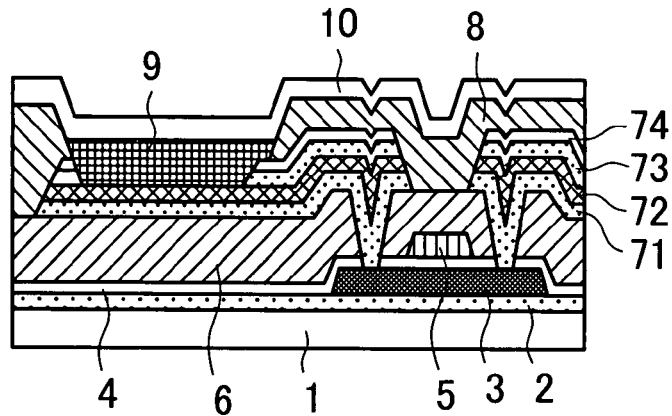
FIG. 4 is a cross-sectional view of a pixel portion according to an embodiment 2 of the present invention.
Figure 5:
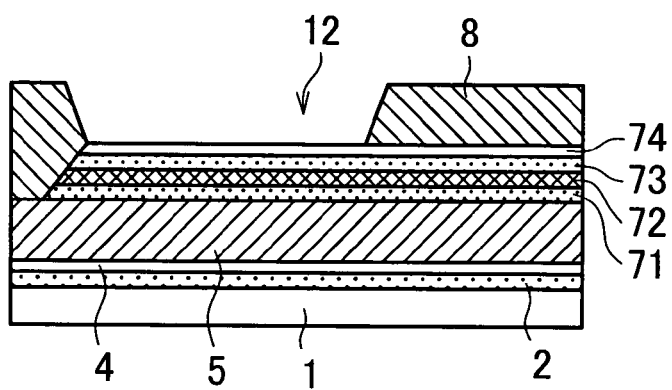
FIG. 5 is a cross-sectional view of a terminal portion according to the embodiment 2 of the present invention.

FIG. 4 and FIG. 5 show the embodiment 2 of the present invention. In this embodiment, a glass substrate is used as the substrate 1. On the glass substrate 1, a silicon nitride film which constitutes an undercoat 2 is formed by a CVD method. On the undercoat 2, an amorphous silicon layer is formed by a plasma CVD method. The amorphous silicon layer is changed to a polysilicon layer by a laser annealing method and a semiconductor layer 3 is formed by patterning using a photolithography method. A gate insulation layer is formed on the semiconductor layer 3 by a plasma CVD method.

An Mo—W alloy layer is stacked on the gate insulation layer by sputtering, and a gate electrode 5 and a gate line layer are formed by patterning using a photolithography method. A silicon oxide film which constitutes the interlayer insulation film 6 is formed to cover the gate electrode 5, a through hole is formed by patterning using a photolithography method and the through hole is used as a contact hole between the SD line layer 7 and the semiconductor layer 3.

On the interlayer insulation film 6, a four-layered stacked film made of Ti/Al—Si alloy/Ti/ITO is formed by sputtering, and an SD line layer 7 is formed by patterning using a photolithography method. In this embodiment, as shown in FIG. 5, the SD line layer 7 is also used as metal of a terminal portion 12. Here, a lower Ti layer 71 plays a role of preventing the contamination of the semiconductor layer 3 by the SD line layer 7, while an Al—Si alloy layer 72 has a role of lowering the line resistance. Further, the Al—Si alloy layer 72 is used as a lower electrode of the organic EL layer 9 and hence, the Al—Si alloy layer 72 functions as an electrode having high reflectance. An upper Ti layer 73 plays a role of preventing a reaction between an ITO layer 74 and the Al—Si alloy layer 72. Further, since the SD line layer 7 is used as a terminal, the ITO layer 74 constitutes an outermost layer portion at the terminal portion 12. Accordingly, the ITO layer 74 has a role of preventing corrosion of the terminal portion 12.

Thereafter, silicon nitride which has a role of passivation is stacked by a plasma CVD method. Next, silicon nitride is removed from the light emitting portion on which the organic EL is to be stacked and the terminal portion 12. ITO remains on a surface of the terminal portion 12. Then, Ti is removed from the light emitting portion. Accordingly, the Al—Si alloy constitutes a lower electrode, that is, a cathode of the organic EL.

Then, an organic EL layer 9 is formed on the light emitting portion by vapor deposition. The organic EL layer 9 is, in the same manner as the embodiment 1, formed in a plurality of layers. Further, an IZO film which constitutes an upper electrode 10, that is, an anode is formed on the upper portion of the organic EL layer 9 by sputtering. Accordingly, in this embodiment, a lower electrode which constitutes a cathode of the organic EL layer 9 is formed of the Al—Si alloy film 72, and the upper electrode 10 which constitutes the anode is formed of the IZO film. IZO is transparent and light from the organic EL layer 9 passes through IZO and is radiated to the outside.

According to this embodiment of the present invention, a process for additionally forming the lower electrode of the organic EL layer 9 can be omitted and, at the same time, the interlayer insulation film 6 is used as a bank for separating pixels and hence, a process for additionally forming a bank can be omitted thus leading to the large reduction of manufacturing cost. Further, the metal layer which is formed as the SD line layer 7 is directly used as the terminal portion 12 and hence, a process for additionally forming the terminal structure can be omitted whereby a manufacturing cost reduction effect can be also acquired from this aspect.

Embodiment 3

Figure 6:
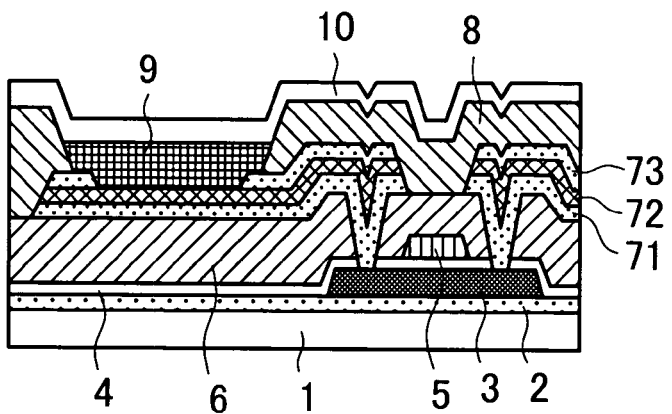
FIG. 6 is a cross-sectional view of a pixel portion according to an embodiment 3 of the present invention.
Figure 7:
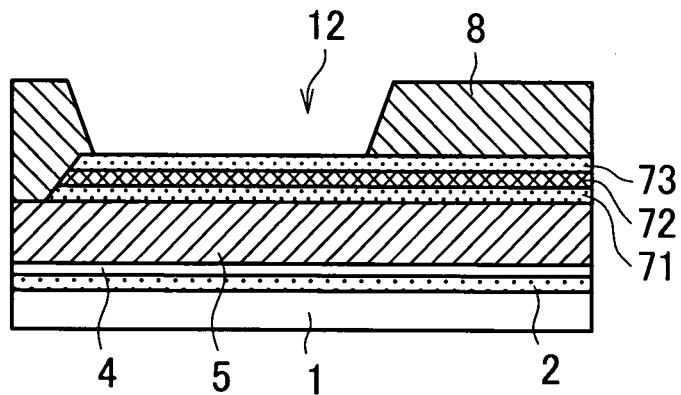
FIG. 7 is a cross-sectional view of a terminal portion according to the embodiment 3 of the present invention.

FIG. 6 and FIG. 7 show the embodiment 3 of the present invention. This embodiment is substantially equal to the embodiment 2 up to the formation of the interlayer insulation film 6. In this embodiment 3, after forming a through hole for ensuring a contact between an interlayer insulation film 6 and a semiconductor layer 3, Ti/Al—Si alloy/Ti are sequentially stacked by sputtering to form an SD metal layer as the SD line layer 7. That is, in this embodiment, the SD line layer 7 has the three-layered structure. Thereafter, by patterning using a photolithography method, the SD line layer 7 and the terminal portion 12 are formed. As shown in FIG. 6 and FIG. 7, the SD line layer 7 and the layer of the terminal portion 12 are formed using the same layer. Although an upper Ti layer 73 is provided on a surface of the terminal portion 12, Ti may be present even in the atmosphere in a stable manner and hence, there is no possibility that the reliability of the terminal portion 12 is damaged.

Thereafter, a silicon nitride film which constitutes a passivation film 8 is formed on the whole surface of the substrate 1 by a CVD method. Thereafter, a silicon nitride film is removed from a light emitting portion on which the organic EL layer 9 is to be formed, and an upper Ti film is removed from the light emitting portion. Then, silicon nitride film is removed from the terminal portion 12. The silicon nitride film of the terminal portion 12 is finally removed for preventing the upper Ti film of the terminal portion 12 from being removed at the time of removing the upper Ti film from the light emitting portion.

Then, an organic EL layer 9 is formed on the light emitting portion by vapor deposition. The organic EL layer 9 is, in the same manner as the embodiment 1, formed in a plurality of layers. Further, an IZO film which constitutes an upper electrode 10, that is, an anode is formed on the upper portion of the organic EL layer 9 by sputtering. Accordingly, in this embodiment, a lower electrode which constitutes a cathode of the organic EL layer 9 is formed of the Al—Si alloy film 72, and the upper electrode 10 which constitutes the anode is formed of the IZO film. IZO is transparent and light from the organic EL layer 9 passes through IZO and is radiated to the outside.

According to this embodiment of the present invention, a process for additionally forming the lower electrode of the organic EL layer 9 can be omitted and, at the same time, the interlayer insulation film 6 is used as a bank for separating pixels and hence, a process for additionally forming a bank can be omitted thus leading to the large reduction of a manufacturing cost. Further, the metal layer which is formed as the SD line layer 7 is directly used as the terminal portion 12 and hence, a process for additionally forming the terminal structure can be omitted whereby a manufacturing cost reduction effect can be also acquired from this view point. In this embodiment, compared to the embodiment 2, a process for applying ITO and a process for removing ITO from the light emitting portion can be omitted and hence, the reduction of manufacturing cost can be also achieved from this aspect.

Embodiment 4

Figure 8:
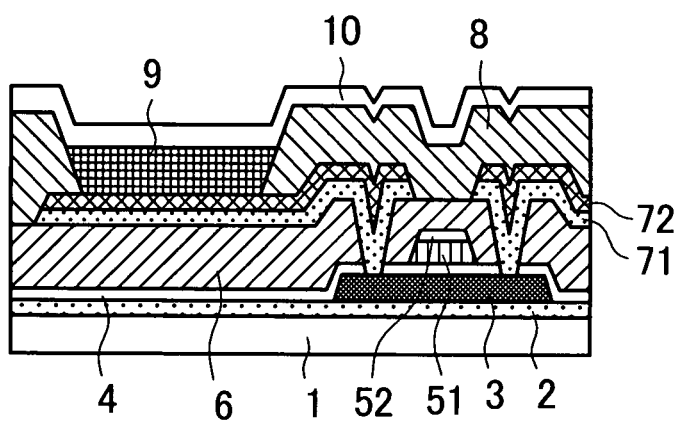
FIG. 8 is a cross-sectional view of a pixel portion according to an embodiment 4 of the present invention.
Figure 9:
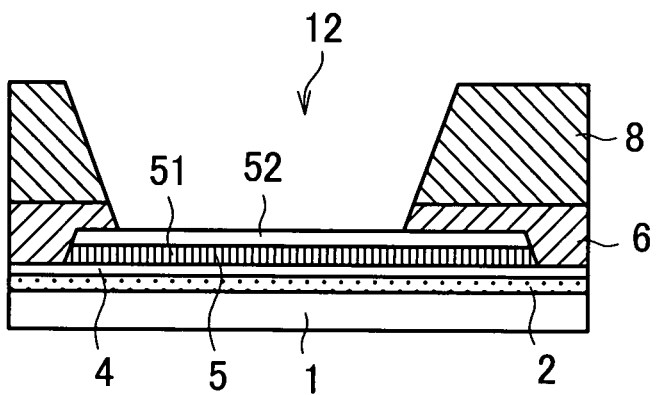
FIG. 9 is a cross-sectional view of a terminal portion according to the embodiment 4 of the present invention.

FIG. 8 and FIG. 9 show the embodiment 4 of the present invention. This embodiment is equal to the embodiment 2 with respect to steps up to the formation of the gate insulation film 4. In this embodiment after forming the gate insulation film 4, the gate electrode layer 5 adopts the stacked structure formed of a MO—W alloy film 51 and an ITO film 52. The gate electrode layer 5 which adopts such stacked structure is used as a terminal portion 12. Since the terminal portion 12 has a surface thereof covered with the ITO film 52, it is possible to prevent the possibility that the terminal portion 12 corrodes.

Thereafter, in the same manner as the embodiment 2, an interlayer insulation film 6 is formed and a through hole for contact is formed. In this embodiment, as a SD line layer 7, a two-layered film made of Ti/Al—Si alloy is used. This is because that, in this embodiment, the SD line layer 7 is not used at the terminal portion 12 and a layer equal to the gate electrode 5 is used at the terminal portion 12 and hence, it is unnecessary to use a chemically stable ITO film or Ti film on a surface of the SD layer.

Then, a silicon nitride film which constitutes a passivation film 8 is formed on the whole surface of a substrate 1 by a CVD method and, thereafter, the silicon nitride film is removed from a light emitting portion on which the organic EL layer 9 is to be formed and the terminal portion 12. Then, the organic EL layer 9 is formed on the light emitting portion by vapor deposition. The organic EL layer 9 is formed in a plurality of layers in the same manner as the embodiment 1. Further, an IZO film which constitutes an upper electrode 10, that is, an anode is formed on the upper portion of the organic EL layer 9 by sputtering. Accordingly, also in this embodiment, a lower electrode which constitutes a cathode of the organic EL layer 9 is formed of the Al—Si alloy film 72, and the upper electrode 10 which constitutes the anode is formed of the IZO film. IZO is transparent and light from the organic EL layer 9 passes through IZO and is radiated to the outside.

According to this embodiment of the present invention, a process for additionally forming the lower electrode of the organic EL layer 9 can be omitted and, at the same time, the interlayer insulation film 6 is used as a bank for separating pixels and hence, a process for additionally forming a bank can be omitted thus leading to the large reduction of a manufacturing cost. Further, the metal layer which is formed as the gate electrode 5 is directly used as the terminal portion 12 and hence, a process for additionally forming the terminal structure can be omitted whereby a manufacturing cost reduction effect can be also acquired from this view point. To compare this embodiment with the embodiment 2, although a step for applying ITO while forming the gate electrode 5 in two layers is added, a step for applying ITO to the SD portion, a step for applying Ti to the SD portion, a process for removing ITO and Ti in the light emitting portion can be omitted and hence, the reduction of manufacturing cost can be also achieved from this aspect.

Embodiment 5

Figure 10:
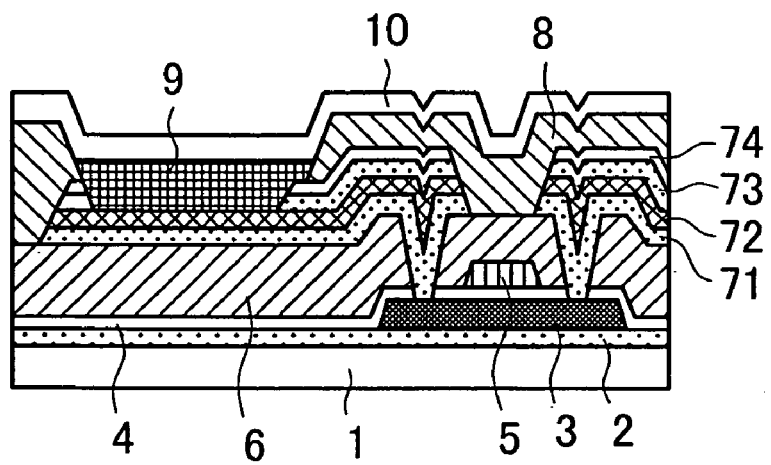
FIG. 10 is a cross-sectional view of a pixel portion according to an embodiment 5 of the present invention.
Figure 11:
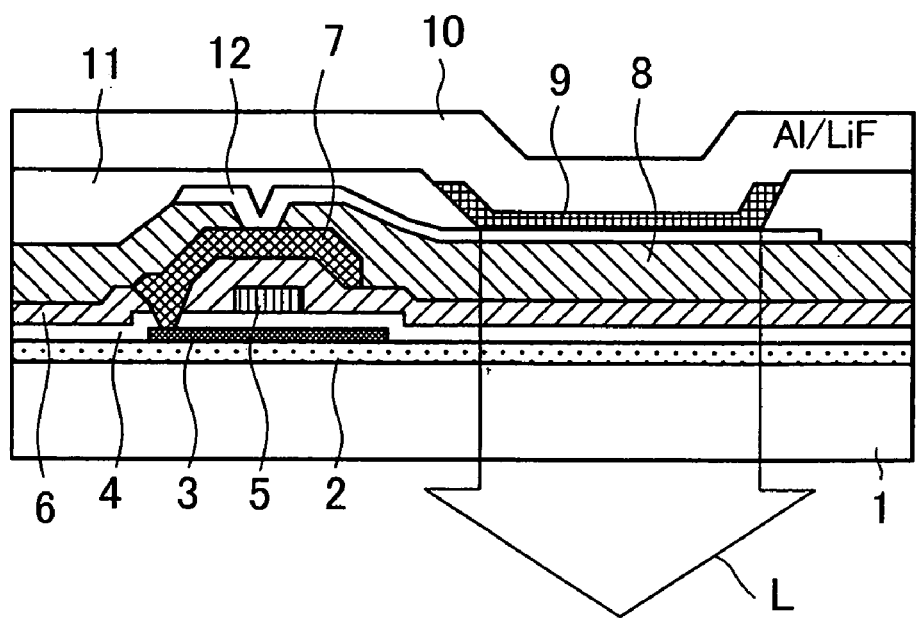
FIG. 11 is a cross-sectional view of a pixel portion of a prior art.

The cross-sectional structure of a pixel portion of this embodiment is shown in FIG. 10. The structure of the terminal portion 12 of this embodiment is equal to the terminal structure of the terminal portion 12 of the embodiment 2 shown in FIG. 5. In this embodiment, as shown in FIG. 10, ITO is removed from a SD line 7 which constitutes a lower electrode of an organic EL layer 9 at a light emitting portion. Accordingly, in this embodiment, Ti is used as a material of a cathode. A work function of Ti is 4.33 eV and is not large compared to a work function 4.28 eV of Al. Accordingly, by properly designing a material and the constitution of an electron injection layer, Ti can be used as the lower electrode, that is, the cathode of the organic EL layer 9.

In this embodiment, uppermost portion of the SD line is covered with ITO except for the light emitting portion and an uppermost layer of a terminal portion is covered with ITO and hence, there is no possibility that layers below Ti are exposed to the atmosphere and is corroded at the terminal portion. Accordingly, as a metal or alloy other than Ti can be used provided that such metal or alloy is proper as a cathode material and is not a material which changes property thereof by reacting with ITO.

According to this embodiment of the present invention, a process for additionally forming the lower electrode of the organic EL layer 9 can be omitted and, at the same time, the interlayer insulation film 6 is used as a bank for separating pixels and hence, a process for additionally forming a bank can be omitted thus leading to the large reduction of manufacturing cost. Further, the metal layer which is formed as the SD line layer 7 is directly used as the terminal portion 12 and hence, a process for additionally forming the terminal portion is unnecessary. Further, a surface of the terminal portion is covered with ITO and hence, the high reliability of the terminal portion is ensured. Still further, only one layer made of ITO is removed at the light emitting portion and hence, a manufacturing cost can be reduced compared to the embodiment 1.

What is claimed is:

1. An organic EL display device which forms each of a plurality of organic EL layers between a respective upper electrode which constitutes an anode and a respective lower electrode which constitutes a cathode, and makes use of emission of light generated by supplying an electric current to the organic EL layers, the organic EL display device comprising:
  a plurality of TFTs formed on a substrate, each TFT having a semiconductor layer, a gate insulation film and a gate electrode;
  an interlayer insulation film formed on the substrate to cover the plurality of TFTs;
  a plurality of SD lines connected with the semiconductor layers of the TFTs and extending over the interlayer insulation film to thereby form the lower electrodes of the organic EL layers, each SD line being formed of a plurality of SD layers including an uppermost layer and a metal layer, the uppermost layer of each SD line being formed of a transparent conducive film and not forming any of the lower electrodes of the organic EL layers, the metal layer of each SD line being made of metal or metal alloy which reflects light; and a plurality of terminal portions connected with the TFTs and the upper electrodes and formed on the substrate, the upper electrodes being formed of a transparent electrode, the terminal portions being formed on a same layer as the SD lines.

2. An organic EL display device according to claim 1, wherein the transparent conductive film which forms the uppermost layer of each SD line is made of ITO, IZO, $WO_3$ or $MoO_3$.

3. An organic EL display device according to claim 1, wherein third SD layers of the plurality of SD layers of the SD lines which are brought into contact with the semiconductor layers are made of Mo, W, Ta, Ti or alloy which contains one of Mo, W, Ta, Ti.

4. An organic EL display device according to claim 1, wherein the metal layers of the SD lines are made of Al, alloy of Al and Si or Cu, alloy of Al and lanthanoids, or Ag.

5. An organic EL display device which forms each of a plurality of organic EL layers between a respective upper electrode which constitutes an anode and a respective lower electrode which constitutes a cathode, and makes use of emission of light generated by supplying an electric current to the organic EL layers, the organic EL display device comprising:

a plurality of TFTs formed on a substrate, each TFT having a semiconductor layer, a gate insulation film and a gate electrode;

an interlayer insulation film formed on the substrate to cover the plurality of TFTs;

a plurality of SD lines connected with the semiconductor layers of the TFTs and extending over the interlayer insulation film to thereby form the lower electrodes of the organic EL layers, each SD line being formed of a plurality of SD layers including an uppermost layer and a metal layer, the uppermost layer of each SD line being formed of a transparent conducive film and not forming any of the lower electrodes of the organic EL layers, the metal layer of each SD line being made of metal or metal alloy which reflects light; and a plurality of terminal portions connected with the TFTs and the upper electrodes and formed on the substrate, the upper electrodes being formed of a transparent electrode, the terminal portions being formed on a same layer as the gate electrodes.

6. An organic EL display device according to claim 5, wherein the gate electrodes are made of Mo, W, Ta, Ti or alloy which contains one of Mo, W, Ta, Ti.

7. An organic EL display device according to claim 5, wherein the gate electrodes are formed of a plurality of gate electrode layers including an uppermost gate electrode layer made of any one of Ti, TiN, ITO and IZO.

8. An organic EL display device which forms each of a plurality of organic EL layers between a respective upper electrode and a respective lower electrode, and makes use of emission of light generated by supplying an electric current to the organic EL layers, the organic EL display device comprising:

a plurality of TFTs formed on a substrate, each TFT having a semiconductor layer, a gate insulation film and a gate electrode;

an interlayer insulation film formed on the substrate to cover the plurality of TFTs;

a plurality of SD lines each formed of a plurality of SD layers the SD lines being connected with the semiconductor layers of the TFTs, the plurality of SD layers having portions extending over the interlayer insulation film to thereby form the lower electrodes of the organic EL layers, the plurality of SD layers including an uppermost layer formed of ITO, IZO $WO_3$ or $MoO_3$ and not forming any of the lower electrodes of the organic EL layers, the metal layer of each SD line being made of metal or metal alloy which reflects light; and a plurality of terminal portions connected with the TFTs and the upper electrodes and formed on the substrate, the upper electrodes being formed of a transparent electrode, the terminal portions being formed on a same layer as the SD lines.

9. An organic EL display device according to claim 8, wherein third SD layers of the plurality of SD layers of the SD lines which are brought into contact with the semiconductor layers are made of Mo, W, Ta, Ti or alloy which contains one of Mo, W, Ta, Ti.

10. An organic EL display device according to claim 8, wherein the plurality of SD layers of each SD line includes a metal layer made of metal or metal alloy which reflects light that is made of Al, alloy of Al and Si or Cu, alloy of Al and lanthanoids, or Ag.

11. An organic EL display device according to claim 8, wherein the plurality of SD layers of the SD lines include third layers which are brought into contact with the organic EL layers and form the lower electrodes are made of Al, alloy of Al and Si or Cu, alloy of Al and lanthanoids, or Ag.

* * * * *